United States Patent
Song et al.

(10) Patent No.: US 10,447,008 B2
(45) Date of Patent: Oct. 15, 2019

(54) LASER DRIVER AND METHOD FOR DRIVING LASER SOURCE THEREOF

(71) Applicant: INDUSTRIAL TECHNOLOGY RESEARCH INSTITUTE, Hsin-Chu (TW)

(72) Inventors: Yu-Cheng Song, Tainan (TW); Chih-Chun Chen, Kaohsiung (TW); Fu-Shun Ho, Tainan (TW); Chien-Hung Lu, New Taipei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 16/156,147

(22) Filed: Oct. 10, 2018

(65) Prior Publication Data

US 2019/0207364 A1 Jul. 4, 2019

(30) Foreign Application Priority Data

Jan. 4, 2018 (TW) ............................. 107100387 A (51) Int. Cl.
*H01S 5/042* (2006.01)
*H01S 5/0687* (2006.01)
*H01S 5/068* (2006.01)

(52) U.S. Cl.
CPC ............ *H01S 5/042* (2013.01); *H01S 5/0687* (2013.01); *H01S 5/06808* (2013.01)

(58) Field of Classification Search
CPC .......... H01J 37/3299; H01L 2924/1426; H03F 3/456; H03K 17/082; H01S 3/09705; H01S 5/042

(Continued)

(56) References Cited

U.S. PATENT DOCUMENTS 5,963,570 A 10/1999 Gnauck et al.
7,166,826 B1 1/2007 Kunst et al.
(Continued)

FOREIGN PATENT DOCUMENTS

CN 101030697 A 9/2007
CN 202183553 U 4/2012
(Continued)

OTHER PUBLICATIONS

C. C. Chen, Economical high-power pump laser drive circuit, Department of Electronic Engineering National Kaohsiung University of Applied Sciences, 1999, Taiwan.
(Continued)

*Primary Examiner* — Tuan N Nguyen (74) *Attorney, Agent, or Firm* — Locke Lord LLP; Tim Tingkang Xia, Esq.

(57) ABSTRACT

A laser driver device is provided, which includes a control circuit, a driver circuit and a feedback circuit. The control circuit receives setup data and convert the setup data into a setup signal. The driver circuit receives the setup signal and generates a drive current according to the setup signal to drive a laser light source. The feedback circuit receives the setup data and the feedback signal of the laser light source and compares the setup data with the feedback signal to generate an adjust signal. The driver circuit receives the adjust signal and adjusts the drive current according to the adjust signal.

10 Claims, 10 Drawing Sheets

(58) Field of Classification Search
USPC .................. 372/38.1, 38.01; 359/346; 385/24
See application file for complete search history.

(56) References Cited

U.S. PATENT DOCUMENTS

| | | | |
|---|---|---|---|
| 7,324,570 B2 | 1/2008 | Moran | |
| 7,423,247 B2 | 9/2008 | Kunst et al. | |
| 7,773,640 B2 | 8/2010 | Hu et al. | |
| 7,826,739 B2 | 11/2010 | Nelson et al. | |
| 7,944,954 B2 | 5/2011 | Jhang et al. | |
| 8,204,350 B2 | 6/2012 | Lin et al. | |
| 8,311,065 B2 | 11/2012 | Tsai et al. | |
| 8,774,239 B2 | 7/2014 | Jhang et al. | |
| 2005/0135440 A1* | 6/2005 | Ikeda | H01S 5/042 372/29.011 |
| 2006/0171432 A1* | 8/2006 | Nagara | G11B 7/1263 372/38.07 |
| 2006/0280212 A1* | 12/2006 | Lu | G01C 15/004 372/38.02 |
| 2008/0063018 A1 | 3/2008 | Hayashi | |
| 2010/0156863 A1* | 6/2010 | Brown | H01S 5/06835 345/207 |
| 2013/0051415 A1 | 2/2013 | Lackey et al. | |
| 2015/0305127 A1* | 10/2015 | Yem | H05B 37/03 372/38.01 |

FOREIGN PATENT DOCUMENTS

| | | |
|---|---|---|
| CN | 104682179 A | 6/2015 |
| CN | 105764177 A | 7/2016 |
| TW | I337267 B | 2/2011 |
| TW | I356410 B | 1/2012 |
| TW | 201249033 A | 12/2012 |
| TW | I380542 B | 12/2012 |
| TW | I426821 B | 10/2018 |

OTHER PUBLICATIONS

Wen Lu et al., Design and implementation of distributed high power LD driver used in fiber laser, IEEE, ICIEA, 2009, 2373-2376.

Fu-Zen Chen et al., High efficiency synchronous pulse laser driver system, IEEE, 2017, 1878-1881.

* cited by examiner

FIG. 9B

LASER DRIVER AND METHOD FOR DRIVING LASER SOURCE THEREOF

CROSS REFERENCE TO RELATED APPLICATION

All related applications are incorporated by reference. The present application is based on, and claims priority from, Taiwan Application Serial Number 107100387, filed on Jan. 4, 2018, the disclosure of which is hereby incorporated by reference herein in its entirety.

TECHNICAL FIELD

The technical field relates to a laser driver, in particular to a laser driver with synchronous feedback mechanism. The technical field further relates to the laser light source driving method of the laser driver.

BACKGROUND

Figure 1:
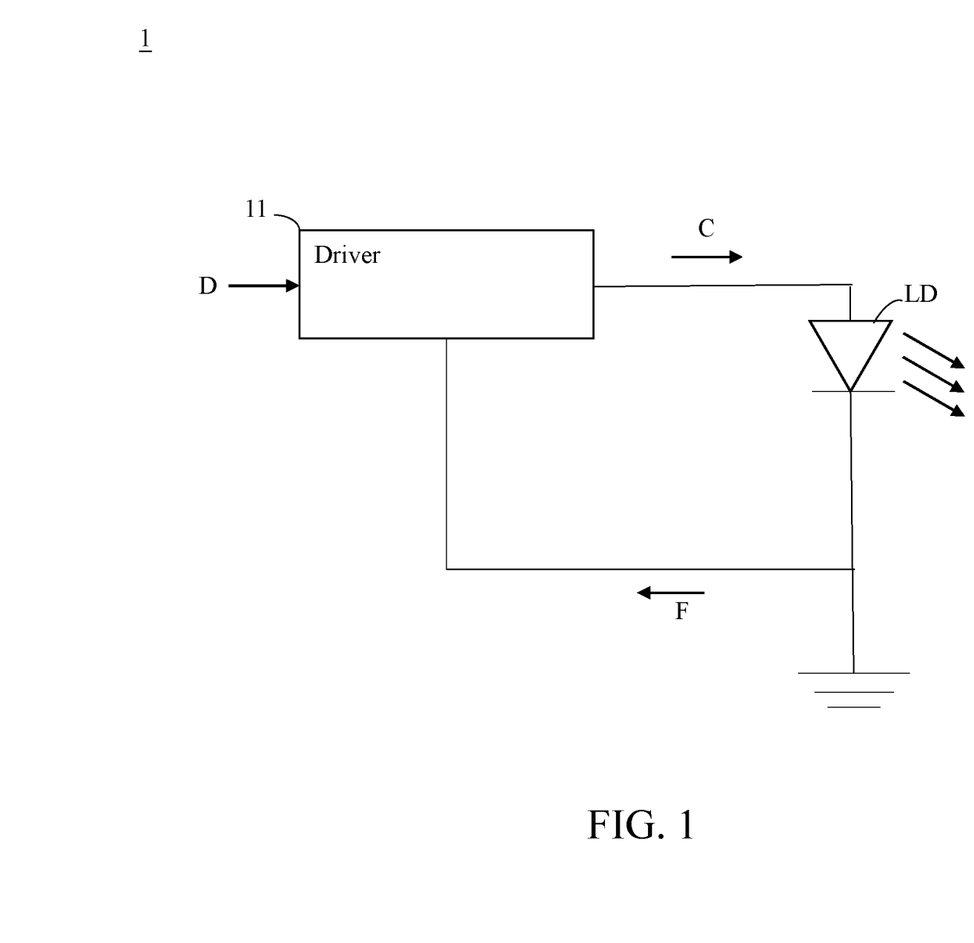
FIG. 1 is a circuit diagram of a currently available laser driver.
Figure 2:
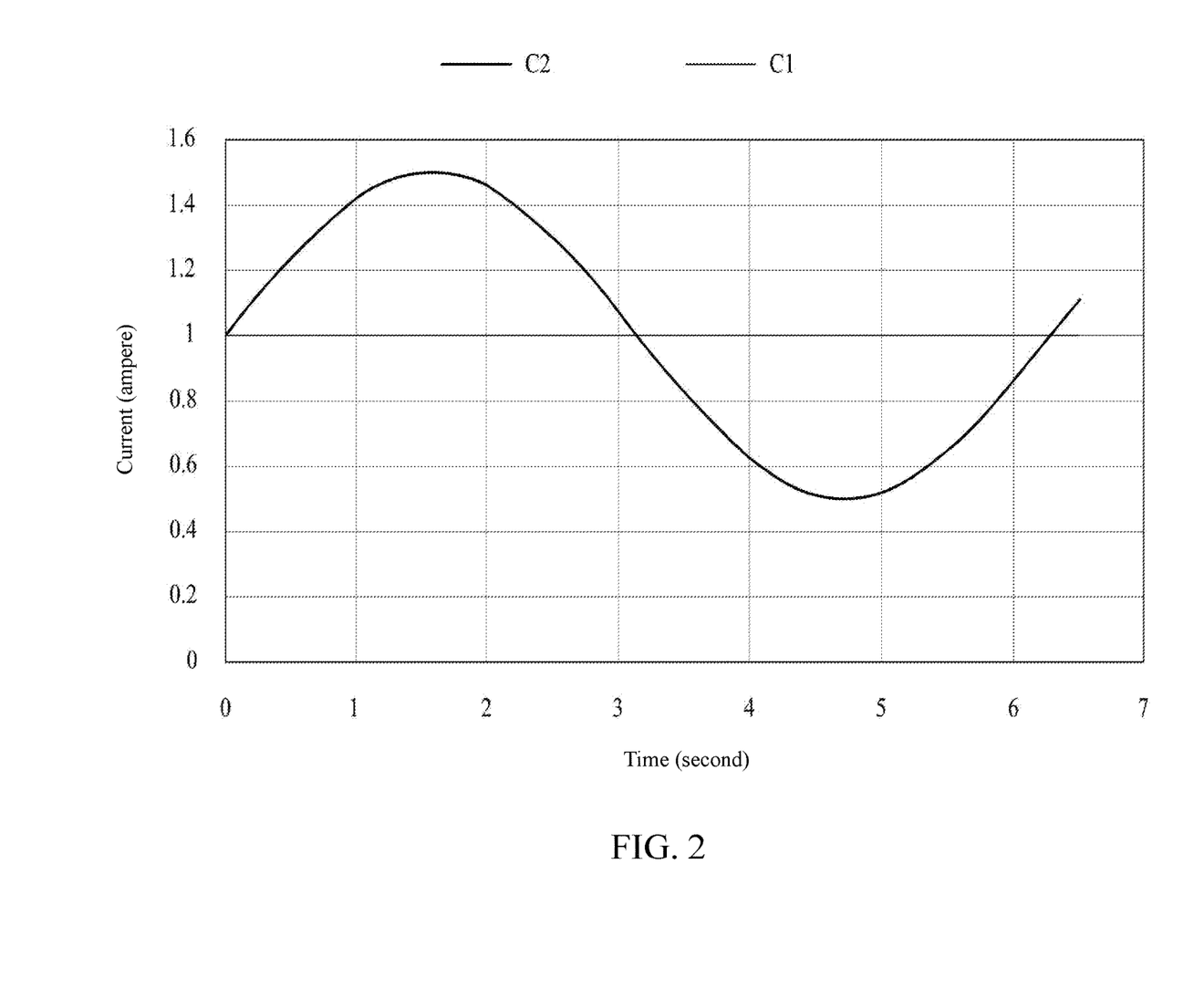
FIG. 2 is a current output diagram of the currently available laser driver.
Figure 3:
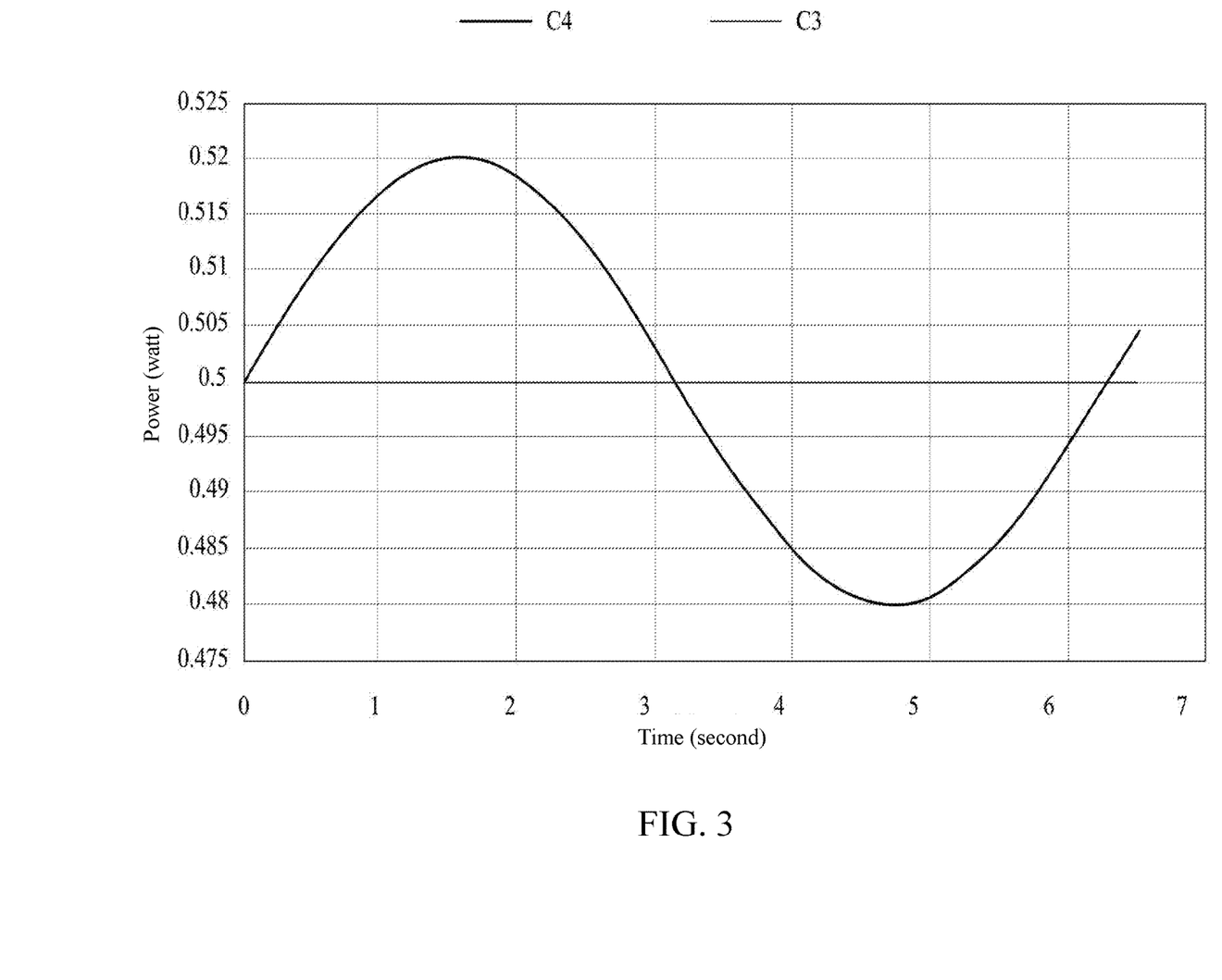
FIG. 3 is a power output diagram of the currently available laser driver.

FIG. 1, FIG. 2 and FIG. 3 are a circuit diagram, current output diagram and a power output diagram of a currently available laser driver respectively. As shown in FIG. 1, the laser driver 1 includes a driver 1.

The driver 11 receives setup data D and generates a drive current C according to the setup data D in order to drive a laser light source LD. Meanwhile, the driver 11 receives a feedback signal F from the laser light source LD. The driver 11 can adjust the drive current C according to the feedback signal F so as to stabilize the drive current C.

FIG. 2 shows the current output diagram of the laser driver 1. The curved line C1 stands for the rated current; the curved line C2 stands for the output current.

FIG. 3 shows the power output diagram of the laser driver 1. The curved line C3 stands for the rated power; the curved line C4 stands for the output power.

Some currently available laser drivers adopt optical feedback mechanism to adjust the drive current.

Some currently available laser drivers adopt both of optical feedback mechanism and current feedback mechanism to adjust the drive current.

Some currently available laser drivers adopt dual-path current driving mechanism, implemented by two drivers, to trim the drive current.

SUMMARY

The present disclosure provides a laser driver device, which may include a control circuit, a driver circuit and a feedback circuit. The control circuit receives setup data and converts the setup data into a setup signal. The driver circuit may receive the setup signal and generate a drive current according to the setup signal to drive a laser light source. The feedback circuit receives the setup data and the feedback signal of the laser light source, and compares the setup data with the feedback signal to generate an adjust signal. The driver circuit receives the adjust signal and adjusts the drive current according to the adjust signal.

The present disclosure further provides a method for driving laser light source, which includes the following steps: receiving setup data and converting the setup data into a setup signal by a control circuit; receiving the setup signal and generating a drive current according to the setup signal to drive a laser light source; receiving the setup data and the feedback signal of the laser light source, and comparing the setup data with the feedback signal to generate an adjust signal by a feedback circuit; and receiving the adjust signal and adjusting the drive current according to the adjust signal by the driver circuit.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 4:
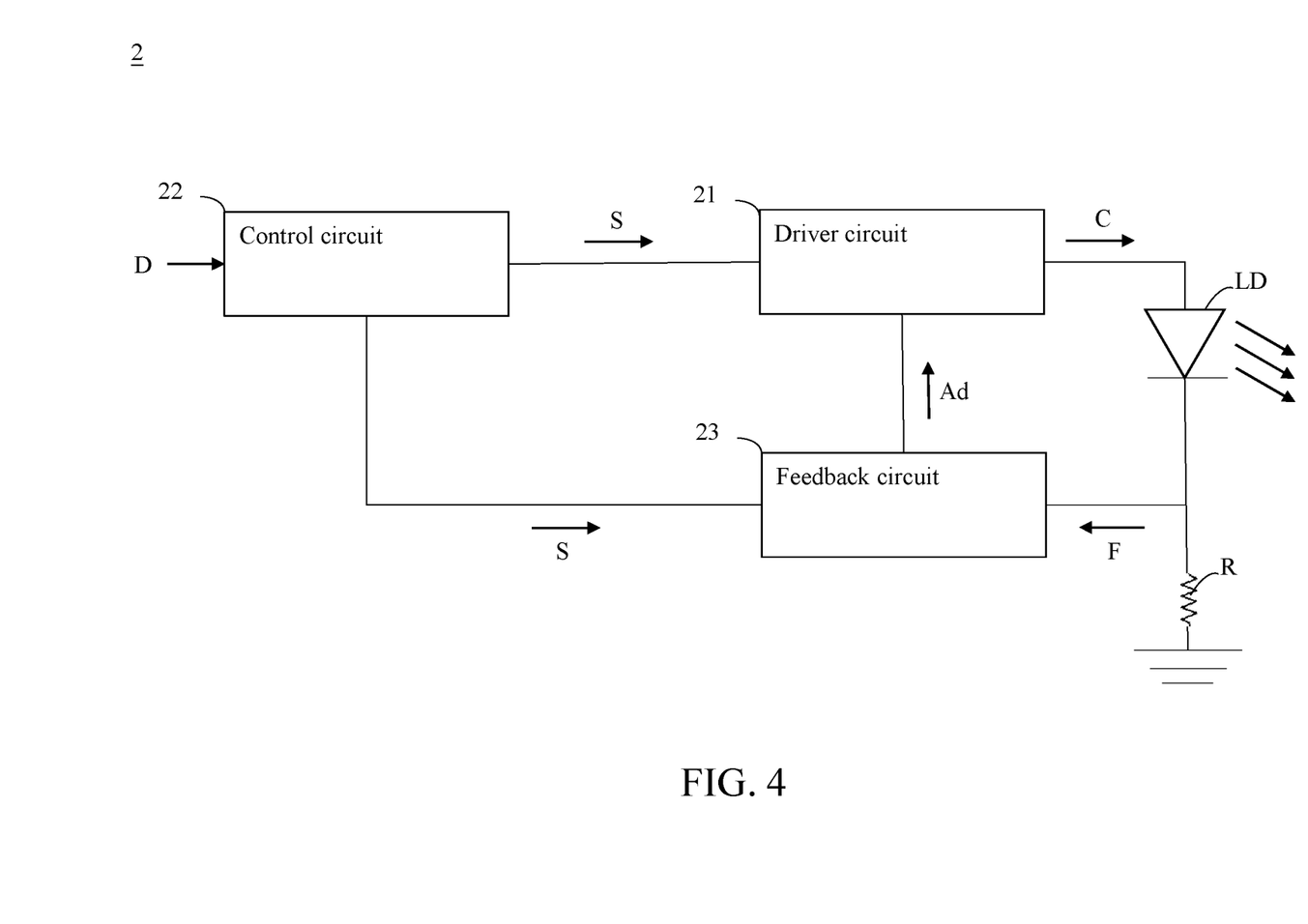
FIG. 4 is a block diagram of a laser driver of a first embodiment in accordance with the present disclosure.

FIG. 4 is a block diagram of a laser driver of a first embodiment in accordance with the present disclosure. As shown in FIG. 4, the laser driver 2 includes a control circuit 22, a driver circuit 21 and a feedback circuit 23.

The control circuit 22 receives setup data D and converts the setup data D into a setup signal S.

The driver circuit 21 is coupled to the control circuit 22 and the laser light source LD. The driver circuit 21 receives the setup signal S and generates a drive current C according to the setup signal S so as to drive a laser light source LD; in a preferred embodiment, the laser light source LD may be a laser diode.

The feedback circuit 23 is coupled to the control circuit 22, the driver circuit 21 and the laser light source LD. The feedback circuit 23 receives the setup signal S and the feedback signal F of the laser light source LD, and compares the setup signal S with the feedback signal F to generate an adjust signal Ad.

Then, the driver circuit 21 receives the adjust signal Ad and adjusts the drive current C according to the adjust signal Ad and the setup signal S.

The feedback signal F of the laser light source LD may be unstable due to environmental factors (e.g. temperature) and the component error of the laser light source LD. However, as described above, the laser driver 2 of the embodiment can implement synchronous feedback mechanism. In other words, the control circuit 22 transmits the setup signal S to the driver circuit 21 to generate the drive current C so as to drive the laser light source LD; meanwhile, the control circuit 22 simultaneously transmits the setup signal S to the feedback circuit 23 for the feedback circuit 21 to process the feedback signal F accordingly, so the adjust signal Ad generated by the feedback circuit 23 can be more stable. Therefore, the driver circuit 21 can adjust the drive current C according to the stable adjust signal Ad and the setup signal S. In this way, the laser driver 2 can have stable current output and power output even though the power output of the laser drive 2 is low (lower than 6% of the rated power thereof).

Besides, in the embodiment, the feedback signal F can be directly fed back to the feedback circuit 23 of the laser driver 2 instead of the driver circuit 21 of the laser driver 2, so the response time of the laser driver 2 can be significantly reduced.

The embodiment just exemplifies the present disclosure and is not intended to limit the scope of the present disclosure. Any equivalent modification and variation according to the spirit of the present disclosure is to be also included within the scope of the following claims and their equivalents.

Figure 5:
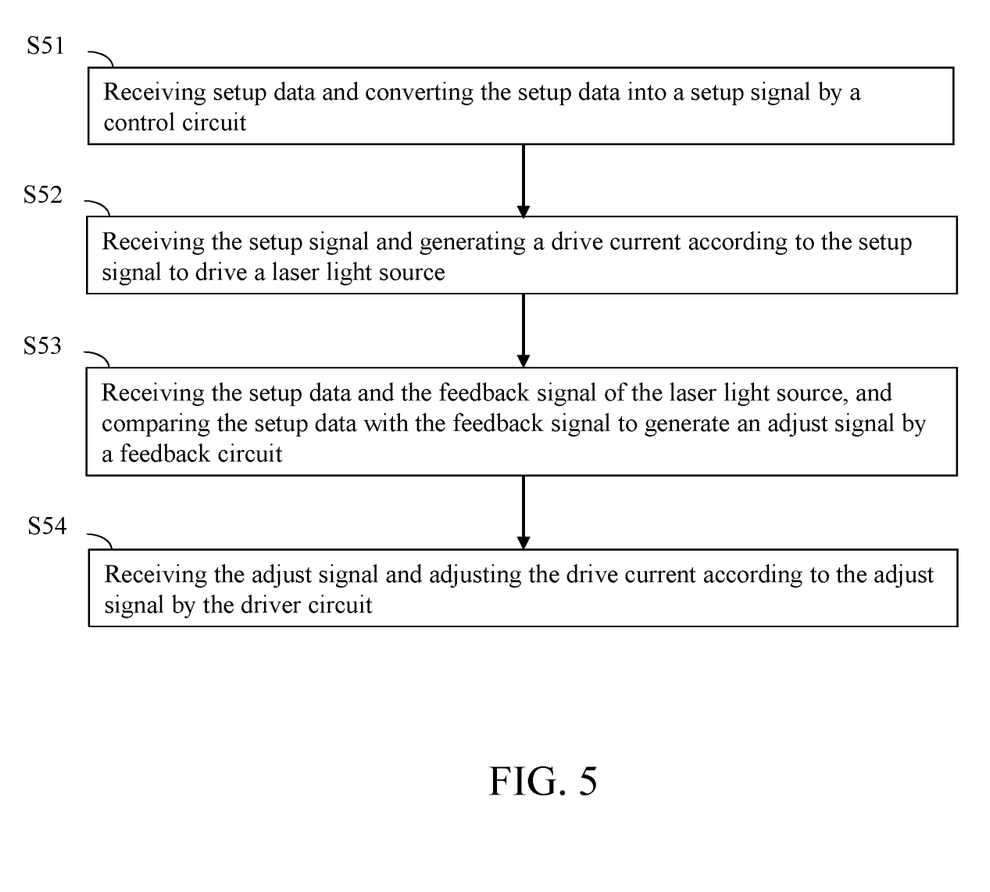
FIG. 5 is a flow chart of the first embodiment in accordance with the present disclosure.

FIG. 5 is a flow chart of the first embodiment in accordance with the present disclosure. The driving method of the laser driver 2 of the embodiment includes the following steps:

Step S51: receiving setup data and converting the setup data into a setup signal by a control circuit.

Step S52: receiving the setup signal and generating a drive current according to the setup signal to drive a laser light source.

Step S53: receiving the setup data and the feedback signal of the laser light source, and comparing the setup data with the feedback signal to generate an adjust signal by a feedback circuit.

Step S54: receiving the adjust signal and adjusting the drive current according to the adjust signal by the driver circuit.

It is worthy to point out that the feedback signal of a laser light source may be unstable because of environmental factors (e.g. temperature) and the component error of the laser light source. However, the currently available laser drivers cannot effectively compensate for these environmental factors and the component error of the laser light source. For the reason, the currently available laser drivers cannot have stable current output and power output when the power output thereof is low (lower than 6% of the rated power thereof). On the contrary, according to one embodiment of the present disclosure, the laser driver adopts synchronous feedback mechanism, which can adjust the feedback signal via the stable signal to generate the adjust signal in order to adjust the drive current. Thus, the laser driver can have stable current output and power output even though the power output of the laser drive is low (lower than 6% of the rated power thereof).

Besides, the currently available laser drivers should directly receive the feedback signal of the laser light source via the driver, which significantly increases the response time of the laser driver. On the contrary, according to one embodiment of the present disclosure, the feedback signal of the laser light source can be directly fed back to the feedback circuit of the laser driver instead of the driver circuit of the laser driver. Therefore, the response time of the laser driver can be significantly decreased.

Figure 6:
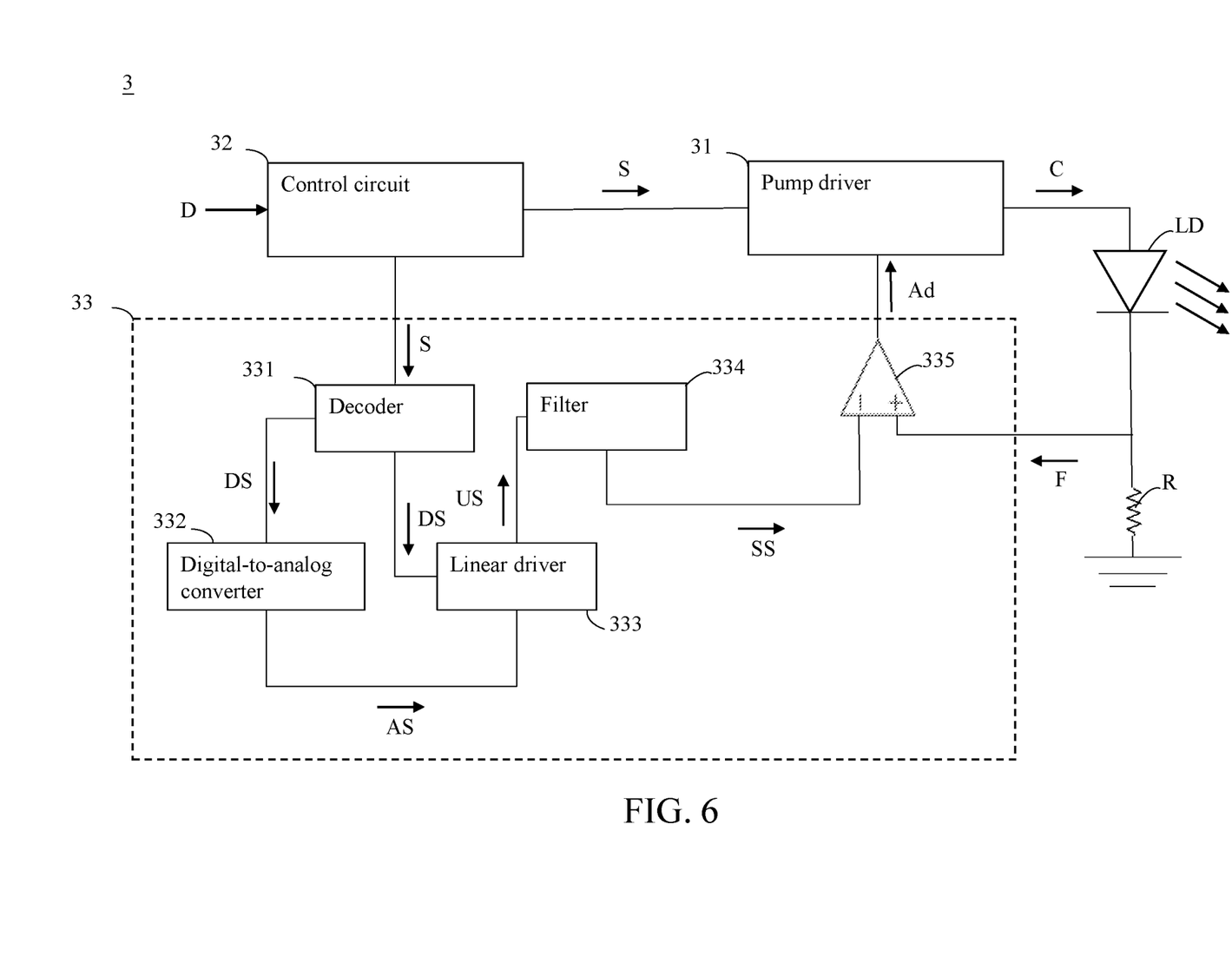
FIG. 6 is a circuit diagram of a laser driver of a second embodiment in accordance with the present disclosure.

FIG. 6 is a circuit diagram of a laser driver of a second embodiment in accordance with the present disclosure. As shown in FIG. 6, the laser driver 3 includes a controller 32, a pump driver 31 and a feedback module 33.

The controller 32 receives setup data D and converts the setup data D into a setup signal S.

The pump driver 31 is coupled to the controller 32 and a laser light source LD. The pump driver 31 receives the setup signal S and generates a drive current C according to the setup signal S so as to drive the laser light source LD.

The feedback module 33 includes a decoder 331, a digital-to-analog converter 332, a linear driver 333, a filter 334 and an operational amplifier 335.

The decoder 331 is coupled to the controller 32. The decoder 331 receives the setup signal S and decodes the setup signal S to generate a digital signal DS. Then, the decoder 331 simultaneously transmits the digital signal DS to the digital-to-analog converter 332 and the linear driver 333.

The digital-to-analog converter 332 receives the digital signal DS and converts the digital signal DS into an analog signal AS. Then, the digital-to-analog converter 333 transmits the analog signal AS to the linear driver 333.

The linear driver 333 receives the digital signal DS and the analog signal AS, generates an output signal US according to the digital signal DS and the analog signal AS and then transmits the output signal US to the filter 334. As the linear driver 333 may have component error, so the digital signal DS inputted into the linear driver 333 may be influenced by oscillation phenomenon. However, the linear driver 333 of the embodiment can trim the digital signal DS according to the analog signal AS in order to compensate for the component error of the linear driver 333, so the output signal US of the linear driver 333 can be more accurate.

The filter 334 receives the output signal US so as to filter the output signal US in order to generate a stable signal SS and then transmits the stable signal SS to the operational amplifier 335. The linear driver 333 may also generate some noise, but the filter 334 can effectively filter out the noise of the linear driver 333, so the stable signal SS outputted from the linear driver 333 can be more accurate.

The operational amplifier 335 receives the stable signal SS and the feedback signal F. More specifically, the stable signal SS is inputted into the inverting input node of the operational amplifier 335 and the feedback signal F is inputted into the non-inverting input node of the operational amplifier 335; then, the operational amplifier 335 outputs an adjust signal Ad from the output node thereof and transmits the adjust signal Ad to the pump driver 31. If the stable signal SS is just equal to the feedback signal F, the operational amplifier 335 does not transmit the adjust signal Ad to the pump driver 31; however, the above situation rarely happens in most applications.

Afterward, the pump driver 31 receives the adjust signal Ad and adjusts the drive current C according to the adjust signal Ad and the setup signal S. In this way, the laser driver 3 can have stable current output and power output.

Figure 7:
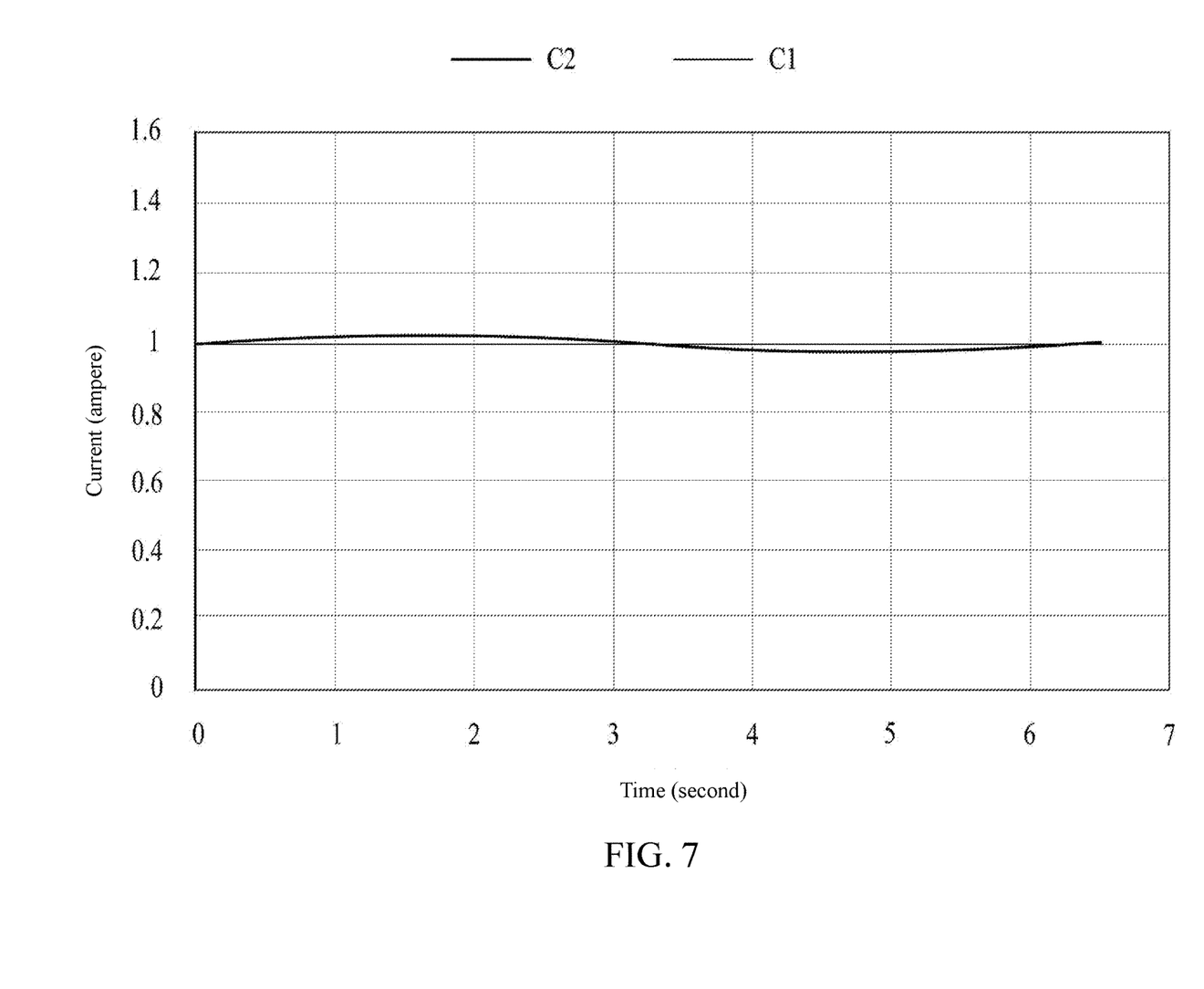
FIG. 7 is a current output diagram of the laser driver of the second embodiment in accordance with the present disclosure.

FIG. 7 is a current output diagram of the laser driver of the second embodiment in accordance with the present disclosure; the curved line C1 stands for the rated current; the curved line C2 stands for the output current. As shown in FIG. 7, the current outputted by the laser driver 3 is very close to the rated current thereof even though the power output of the laser driver 3 is low (lower than 6% of the rated power thereof). Therefore, the synchronous feedback mechanism of the laser driver 3 can actually allow the laser driver 3 to have stable current output.

Figure 8:
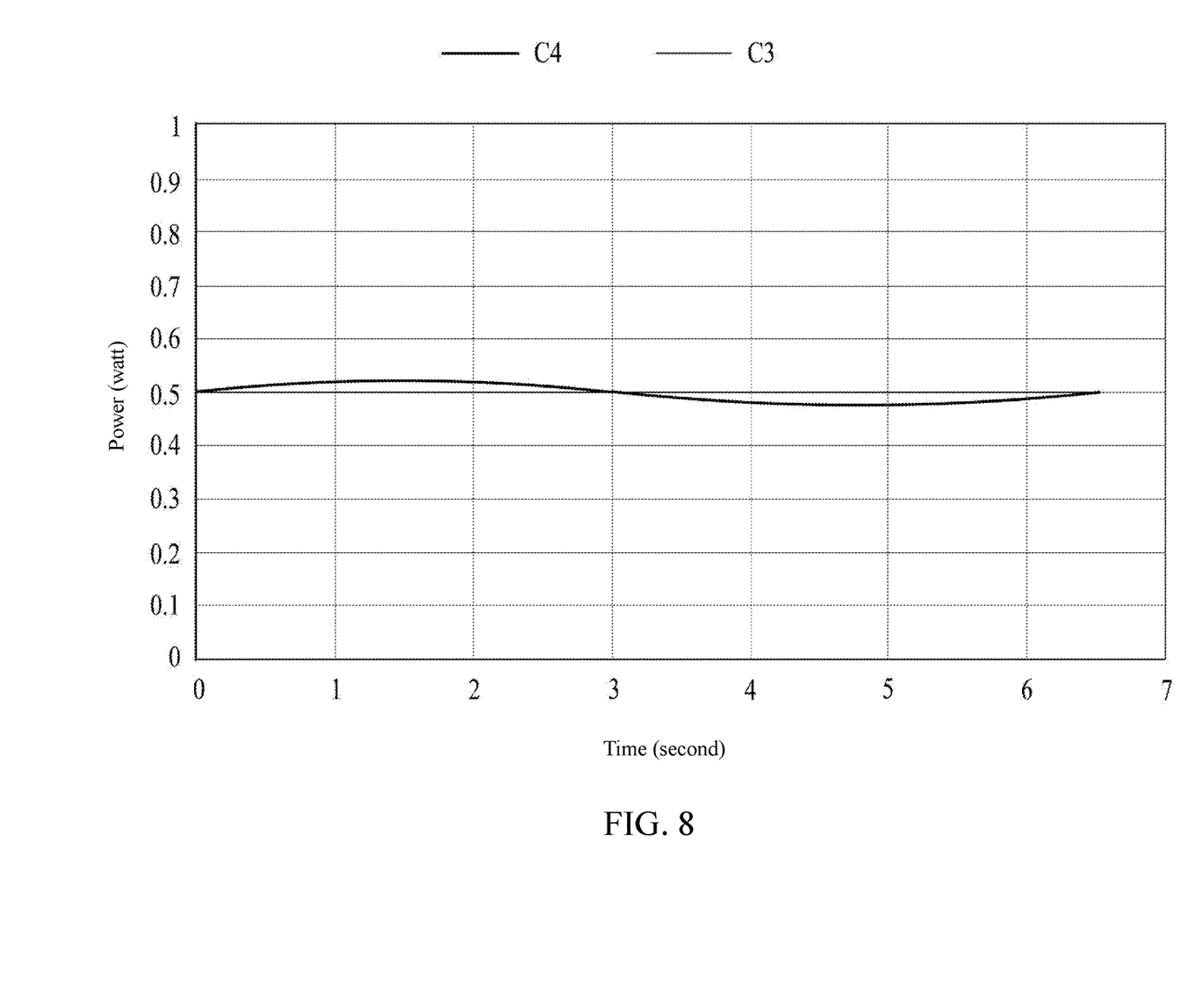
FIG. 8 is a power output diagram of the laser driver of the second embodiment in accordance with the present disclosure.

FIG. 8 is a power output diagram of the laser driver of the second embodiment in accordance with the present disclosure; the curved line C3 stands for the rated power; the curved line C4 stands for the output power. As shown in FIG. 8, the power outputted by the laser driver 3 is very close to the rated power thereof even though the power output of the laser driver 3 is low (lower than 6% of the rated power thereof). Therefore, the synchronous feedback mechanism of the laser driver 3 can actually allow the laser driver 3 to have stable power output.

As described above, the synchronous feedback mechanism of the laser driver 3 can definitely improve the performance of the laser driver 3.

In addition, the feedback module includes the digital-to-analog converter 332 and the filter 333. The digital-to-analog converter 332 can compensate for the component error of the linear driver 333; the filter 334 can filter out the noise of the linear driver 333, which can significantly better the optimization effect of synchronous feedback mechanism.

The embodiment just exemplifies the present disclosure and is not intended to limit the scope of the present disclosure. Any equivalent modification and variation according to the spirit of the present disclosure is to be also included within the scope of the following claims and their equivalents.

It is worthy to point out that the currently available laser drivers may need photodiodes, thermistors and other additional circuit components, which significantly increase the cost, power consumption and complexity of the currently available laser drivers. On the contrary, according to one embodiment of the present disclosure, the laser driver can adjust the drive current only by receiving the feedback signal of the laser light source, and does not need photodiodes, thermistors and other additional circuit components. Accordingly, the cost, power consumption and complexity of the laser driver can be significantly reduced.

Besides, according to one embodiment of the present disclosure, the feedback circuit of the laser driver can include a digital-to-analog converter, which can convert the digital signal into the analog signal; thus, the linear driver can trim the digital signal according to the analog signal to compensate for the component error of the linear driver so as to make the stable signal outputted from the linear driver more accurate. Therefore, the current output and power output of the laser driver can be more stable.

Moreover, according to one embodiment of the present disclosure, the feedback circuit of the laser driver includes a filter, which can filter the noise of the linear driver, so the stable signal outputted from the linear driver can be more accurate. Therefore, the current output and power output of the laser driver can be more stable.

Figure 9A:
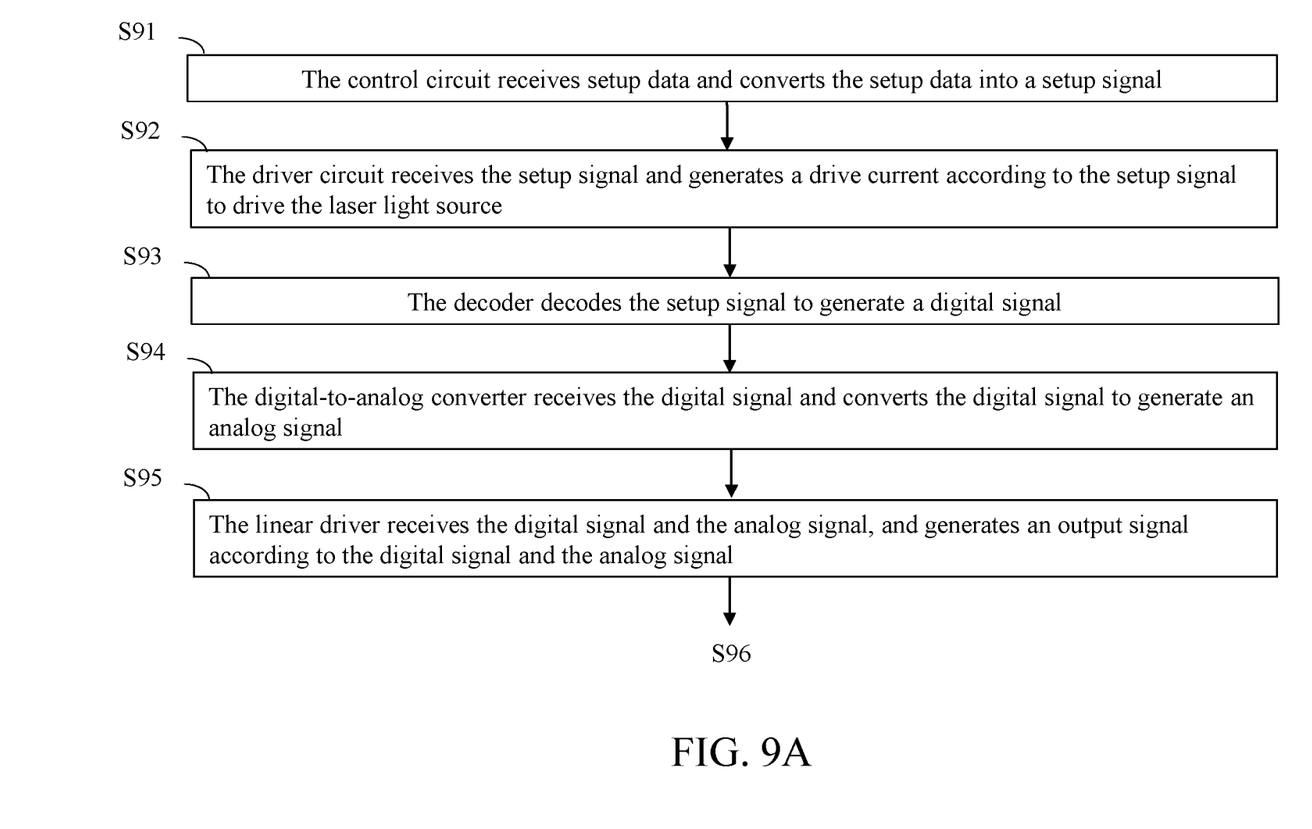
FIG. 9A is a first flow chart of the second embodiment in accordance with the present disclosure.
Figure 9B:
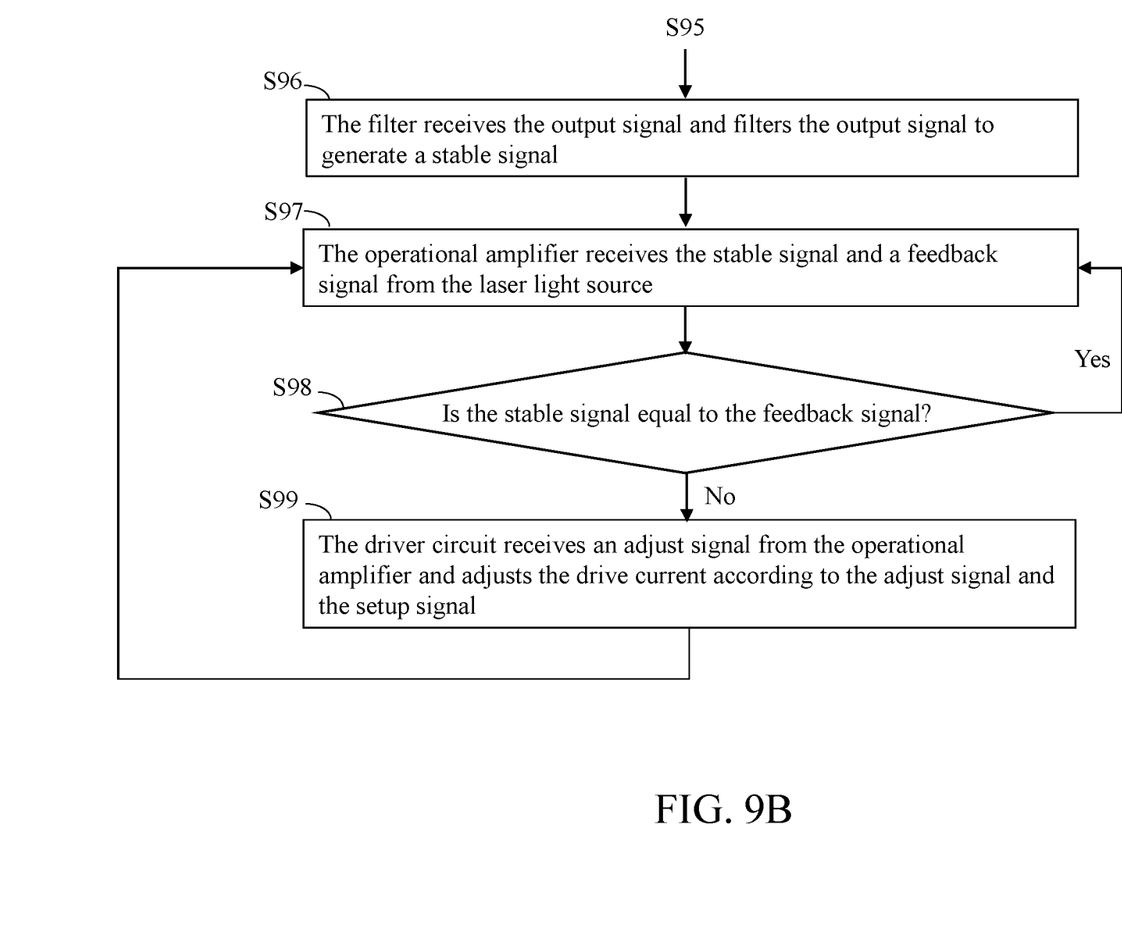
FIG. 9B is a second flow chart of the second embodiment in accordance with the present disclosure.

FIG. 9A and FIG. 9B are a first flow chart and a second flow chart of the second embodiment in accordance with the present disclosure respectively. The driving method of the laser driver 3 of the embodiment includes the following steps:

Step S91: the control circuit receives setup data and converts the setup data into a setup signal.

Step S92: the driver circuit receives the setup signal and generates a drive current according to the setup signal to drive the laser light source.

Step S93: the decoder decodes the setup signal to generate a digital signal.

Step S94: the digital-to-analog converter receives the digital signal and converts the digital signal to generate an analog signal.

Step S95: the linear driver receives the digital signal and the analog signal, and generates an output signal according to the digital signal and the analog signal.

Step S96: the filter receives the output signal and filters the output signal to generate a stable signal.

Step S97: the operational amplifier receives the stable signal and a feedback signal from the laser light source.

Step S98: the operational amplifier determines whether the stable signal equal is equal to the feedback signal. If it is, the process returns to Step S97; if it is not, the process proceeds to Step S99.

Step S99: the driver circuit receives an adjust signal from the operational amplifier and adjusts the drive current according to the adjust signal and the setup signal; then, the process returns to Step S97.

To sum up, according to one embodiment of the present disclosure, the laser driver adopts synchronous feedback mechanism, which can adjust the feedback signal via the stable signal to generate the adjust signal in order to adjust the drive current. Thus, the laser driver can have stable current output and power output even though the power output of the laser drive is low (lower than 6% of the rated power thereof).

Also, according to one embodiment of the present disclosure, the feedback signal of the laser light source can be directly fed back to the feedback circuit of the laser driver instead of the driver circuit of the laser driver. Therefore, the response time of the laser driver can be significantly decreased.

Besides, according to one embodiment of the present disclosure, the laser driver can adjust the drive current only by receiving the feedback signal of the laser light source, and does not need photodiodes, thermistors and other additional circuit components. Accordingly, the cost, power consumption and complexity of the laser driver can be significantly reduced.

Moreover, according to one embodiment of the present disclosure, the feedback circuit of the laser driver can include a digital-to-analog converter, which can convert the digital signal into the analog signal; thus, the linear driver can trim the digital signal according to the analog signal to compensate for the component error of the linear driver so as to make the stable signal outputted from the linear driver more accurate. Therefore, the current output and power output of the laser driver can be more stable.

Furthermore, according to one embodiment of the present disclosure, the feedback circuit of the laser driver includes a filter, which can filter the noise of the linear driver, so the stable signal outputted from the linear driver can be more accurate. Therefore, the current output and power output of the laser driver can be more stable.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A laser driver device, comprising:
   a control circuit, configured to receive a setup data and convert the setup data into a setup signal;
   a driver circuit, configured to receive the setup signal and generating a drive current according to the setup signal to drive a laser light source; and
   a feedback circuit, comprising:
     a decoder configured to decode the setup signal to generate a digital signal;
     a digital-to-analog converter configured to receive the digital signal and convert the digital signal into an analog signal;
     a linear driver configured to receive the digital signal and the analog signal, and generate an output signal according to the digital signal and the analog signal;
     a filter configured to receive the output signal and filter the output signal to generate a stable signal; and
     an operational amplifier configured to receive the stable signal and the feedback signal, and generate an adjust signal according to the stable signal and the feedback signal;
   wherein the feedback signal is inputted into a non-inverting input node of the operational amplifier and the adjust signal is outputted from an output node of the operational amplifier, and the driver circuit receives the adjust signal and adjusts the drive current according to the adjust signal.

2. The laser driver device of claim 1, wherein the stable signal is inputted into an inverting input node of the operational amplifier.

3. A method for driving laser light source, comprising:
   receiving a setup data and converting the setup data into a setup signal by a control circuit;
   receiving the setup signal and generating a drive current according to the setup signal to drive a laser light source;
   receiving the setup data and a feedback signal of the laser light source, and comparing the setup data with the feedback signal to generate an adjust signal by a feedback circuit, comprising:
     decoding the setup signal to generate a digital signal by a decoder of the feedback circuit;
     receiving the digital signal and converting the digital signal into an analog signal by a digital-to-analog converter of the feedback circuit;
     receiving the digital signal and the analog signal, and generating an output signal according to the digital signal and the analog signal by a linear driver of the feedback circuit;
     receiving the output signal and filtering the output signal to generate a stable signal by a filter of the feedback circuit;
     receiving the stable signal and the feedback signal, and generating the adjust signal according to the stable signal and the feedback signal by an operational amplifier of the feedback circuit;
     inputting the feedback signal into a non-inverting input node of the operational amplifier; and
     outputting the adjust signal from an output node of the operational amplifier; and
   receiving the adjust signal and adjusting the drive current according to the adjust signal by the driver circuit.

4. The laser driver device of claim 1, wherein the laser light source is a laser diode.

5. The laser driver device of claim 1, wherein the setup data comprises one or more of a current parameter, a power parameter and a frequency parameter.

6. A method for driving laser light source, comprising:
   receiving a setup data and converting the setup data into a setup signal by a control circuit;
   receiving the setup signal and generating a drive current according to the setup signal to drive a laser light source;
   receiving the setup data and a feedback signal of the laser light source, and comparing the setup data with the feedback signal to generate an adjust signal by a feedback circuit; and
   receiving the adjust signal and adjusting the drive current according to the adjust signal by the driver circuit.

7. The method of claim 6, wherein the step of receiving the setup data and the feedback signal of the laser light source, and comparing the setup data with the feedback signal to generate the adjust signal by the feedback circuit further comprises:
   inputting the stable signal into an inverting input node of the operational amplifier.

8. The method of claim 6, wherein the driver circuit is a pump driver.

9. The method of claim 6, wherein the laser light source is a laser diode.

10. The method of claim 6, wherein the setup data comprises one or more of a current parameter, a power parameter and a frequency parameter.

* * * * *